United States Patent [19]
Connell et al.

[11] Patent Number: 5,406,146
[45] Date of Patent: Apr. 11, 1995

[54] CIRCUIT AND METHOD FOR GENERATING A BUFFERED OUTPUT HAVING LOW DISTORTION

[75] Inventors: Lawrence F. Connell, Naperville; Timothy T. Rueger, Rolling Meadows, both of Ill.

[73] Assignee: Motorola, Inc., Schaumburg, Ill.

[21] Appl. No.: 151,332

[22] Filed: Nov. 9, 1993

[51] Int. Cl.6 ............................................. H03F 3/45
[52] U.S. Cl. .................................. 327/333; 327/317; 327/108
[58] Field of Search ................... 330/9, 278; 307/263, 307/359, 491, 493, 494, 572

[56] References Cited

U.S. PATENT DOCUMENTS 4,720,686  1/1988  Westwick .......................... 330/258

OTHER PUBLICATIONS

Fiez, Terri S., Yang, Howard C., Yang, John J., Yu, Choung, and Allstot, David J., "A Family of High-Swing CMOS Operational Amplifiers", *IEEE Journal of Solid-State Circuits*, vol. 24, No. 6., Dec. 1989, pp. 1683–1687.

Primary Examiner—Timothy P. Callahan
Assistant Examiner—Jeffrey Zweizig
Attorney, Agent, or Firm—John J. King

[57] ABSTRACT

A circuit and method provides a low distortion buffer by using a resistive divider stage (18, 20) and a gain stage (12) whose gain is equal to the inverse of the attenuation ratio of the resistive divider to provide unity gain. Multiple inputs (14, 42, 44, . . . 46) to the buffer circuit are accommodated by an input switching network (30, 38). The gain error introduced by the resistance of the switching network (30, 38) is canceled by placing an equivalent network (60) in a feedback path of the gain stage. The preferred circuit topology is well-suited to low-voltage applications and provides a low-distortion output. Circuits for reducing power consumption (68, 70) and minimizing undesirable transients (72) are also provided.

14 Claims, 2 Drawing Sheets

— PRIOR ART —

CIRCUIT AND METHOD FOR GENERATING A BUFFERED OUTPUT HAVING LOW DISTORTION

FIELD OF THE INVENTION

The present invention is generally related to buffer circuits, and more particularly to a low distortion buffer circuit and method for generating a buffered output.

BACKGROUND OF THE INVENTION

Buffering output signals in an integrated circuit (IC) application is well known. Because typical internal circuits of an IC lack sufficient current to drive external capacitances, a separate output driver is usually necessary. One common solution is to use an operational amplifier (op amp) tied in a unity gain feedback configuration, which is well known in the art. An op amp in a unity gain feedback configuration generally has good distortion characteristics.

However, employing an output driver in this manner generally suffers when the supply voltage is very low and the input common mode voltage range is restricted. Low voltage swings must be used, reducing the signal to noise ratio. Accordingly, there is a need for a low distortion buffer circuit capable of operating with a low supply voltage and a wide input voltage range.

DESCRIPTION OF THE PREFERRED EMBODIMENT

Generally, the present invention provides a method and apparatus for a low distortion buffer. This is accomplished by use of a resistive divider stage and a gain stage whose gain is equal to the inverse of the attenuation ratio of the resistive divider to provide unity gain. Multiple inputs to the buffer circuit are accommodated by means of an input switching network. The gain error and distortion introduced by the resistance of the switching network is canceled by placing an equivalent network in the feedback network of the gain stage. The preferred circuit topology is well-suited to low-voltage applications and provides a low-distortion output. Means of reducing power consumption and minimizing undesirable transients are also provided.

Figure 1:
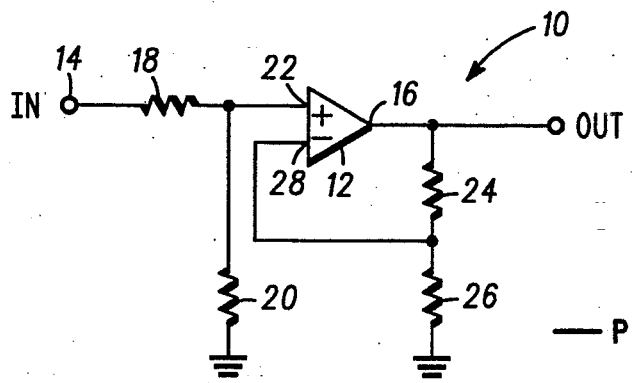
FIG. 1 is a circuit diagram of a conventional buffer circuit including an operational amplifier.

The present invention can be more fully described with reference to FIGS. 1–4. FIG. 1 illustrates a conventional buffer circuit 10 including an operational amplifier (op amp) 12 configured as a buffer. In particular, the voltage at input node 14 is buffered to the output node 16. Resistors 18 and 20 attenuate the input voltage signal to the non-inverting input 22 of the op amp. Resistor 18 is connected between the input voltage 14 and the non-inverting op amp input 22. Resistor 20 is connected between the non-inverting op amp input 22 and a ground potential. Resistors 24 and 26 provide an attenuation of the voltage at the output node 16 to the inverting input 28 of the op amp. Resistor 24 is connected between the output node 16 and the inverting op amp input 28. Resistor 26 is connected between the inverting op amp input 28 and a ground potential.

It can readily be seen that the voltage gain of buffer circuit 10 is $$[R20/(R18+R20)][(R24+R26)/R26]$$

where RXX denotes the resistance of resistor XX. Resistances R18 and R24 must be substantially equal and resistances R20 and R26 must be substantially equal for this voltage gain to equal unity.

Typically, the resistors are implemented as lightly doped diffused resistors. Such resistors typically have high resistivity, which reduces current drive requirements. A significant drawback of diffused resistors is that they have a resistance that changes with signal voltage, due to variation in the width of the depletion region caused by reverse biasing of the junction which isolates the resistor from the substrate. This variation is canceled in circuit 10. Op amp 12 constrains the voltage differences across resistor 18 and resistor 24 to be equal, and also constrains the voltage differences across resistor 20 and resistor 26 to be equal. The resistances R18 and R24 are maintained as equal and the resistances R20 and R26 are maintained as equal; the voltage gain is maintained at unity.

Figure 2:
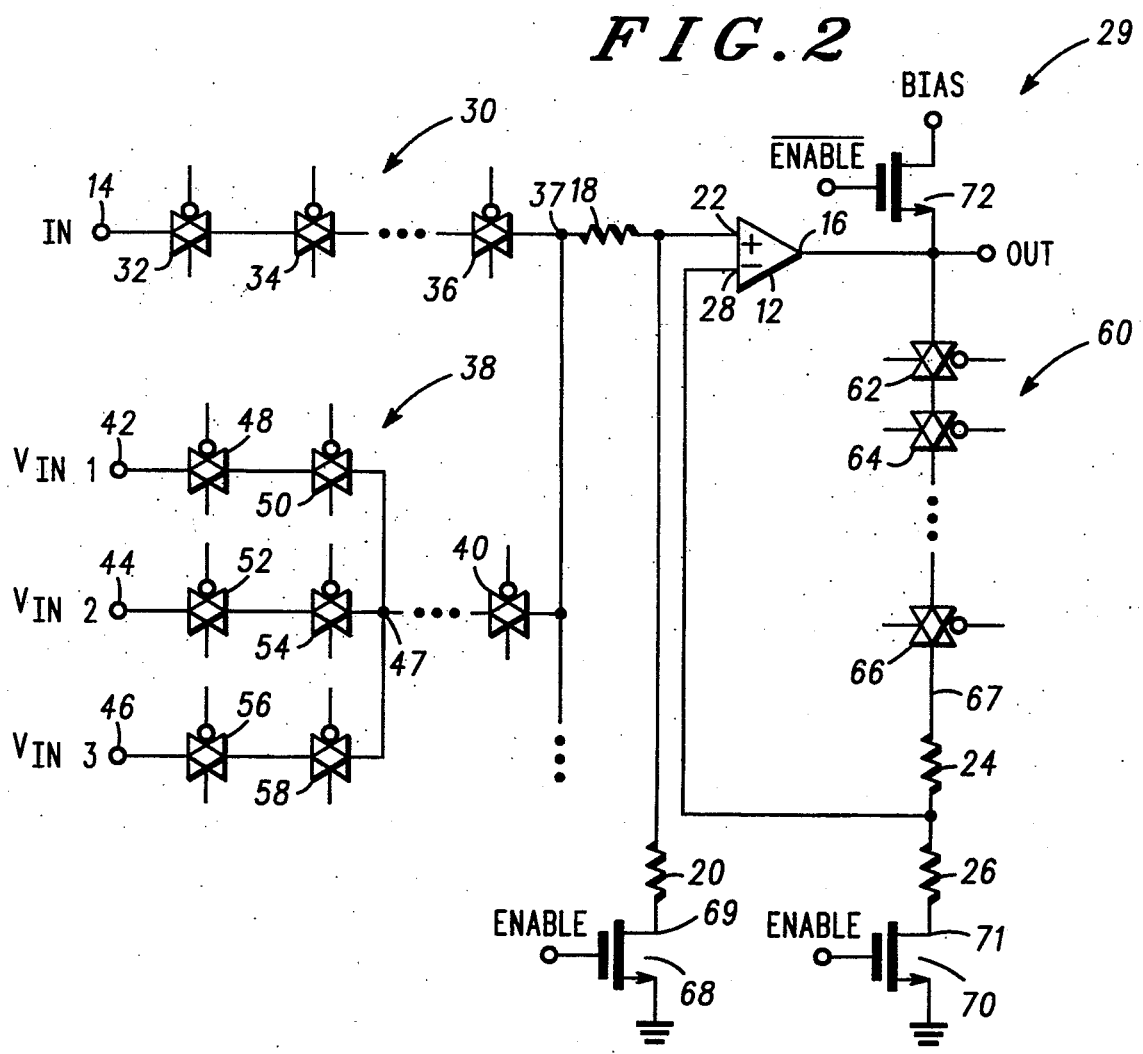
FIG. 2 is a detailed schematic of the circuit for generating a buffered output according to the present invention.

FIG. 2 illustrates a detailed schematic of the buffer circuit 29 of the present invention. The like components of FIG. 1 are similarly marked in FIG. 2. Accordingly, only additional elements added to the circuit of FIG. 1 are described in detail. A switching element 30 consisting of a number of individual switches (32, 34 . . . 36) is connected between input node 14 and a node 37. Resistor 18 is connected between node 37 and node 22. Means of selecting multiple input voltages is provided by switch network 38 having a series of switches coupled to a node 47 and series of switches 40. One of alternate several inputs (42, 44, and 46) may be connected to node 47 by enabling switches 48 and 50 for input 42, switches 52 and 54 for input 44, or switches 56 and 58 for input 46. The series of switches 40 may be similarly enabled. Preferably, there is an equal number of switches in any path from the inputs 14, 42, 44, or 46 to node 37.

One may see that any switch network may be used in place of switch networks 30 and 38. Such a network is constrained to have an equal number of series switches connecting any driving source input to node 37.

Another series of switches 60, consisting of a series of switches (62, 64 . . . 66) is connected between output node 16 and node 67. The number of switches in switch series 60 is equal to the number of series switches connecting any of the inputs 14, 42, 44, and 46 to node 37. Resistor 24 is connected between node 67 and node 28. Preferably, resistor 18 is substantially equal to resistor 24, and resistor 20 is substantially equal to resistor 26. Also, the switches in switch networks 30, 38, and 60 are substantially equal in size.

Additional elements can be added to reduce power consumption and reduce undesirable transients. A switch device 68 is connected between node 69 and a ground potential. A second switch device 70 is connected between node 71 and a ground potential. Switch devices 68 and 70 are preferably transistors, although other devices could be used. Switch devices 68 and 70 generally reduce power loss in the system. Switch devices 68 and 70 are disabled when the circuit is not in use. This interrupts the continuous current drain of the resistor networks, conserving power in the system. Finally, a switch device 72 is connected between output node 16 and an operational bias. Switching device 72 is preferably a transistor and is included to reduce undesirable transients.

The voltage gain of buffer circuit is $$[(R20+R68)/(R30+R18+R20+R68)] \cdot [(R60+R24+R26+R70)/(R26+R70)]$$

where R68 denotes the series resistance of switch 68, R30 denotes the resistance of the series of switches connecting a driving source to node 37, R60 denotes the resistance of the series of switches connecting node 16 and node 67, and R70 denotes the series resistance of switch 70.

The voltage difference between node 22 and ground is constrained by the op amp to be equal to that between node 28 and ground. Similarly, the voltage difference between nodes 14 and 22 is constrained by the op amp to be equal to that between nodes 16 and 28. Nonlinearities in the resistance values R18, R20, R24, R26, R30, R60, R68, and R70 are canceled out, and the voltage gain of circuit 29 is maintained at unity.

In the preferred embodiment, the resistors used are substantially equal in size and the switch networks have substantially equal impedances. An alternate embodiment may maintain a unity voltage gain with appropriate resizing of components. Each component in the feedback network may be identically scaled to maintain a feedback attenuation ratio substantially equal to the input attenuation ratio.

Circuit 29 of FIG. 2 provides means of eliminating undesirable transients when the circuit is re-enabled. During disable mode, the output node is connected through switch device 72 to a potential which is substantially equal to the operational bias when the circuit is enabled. This prevents voltage drift on the node when amplifier 12 is not providing a drive. When amplifier 12 is re-enabled, there is minimal excursion of the voltage at node 16.

Figure 3:
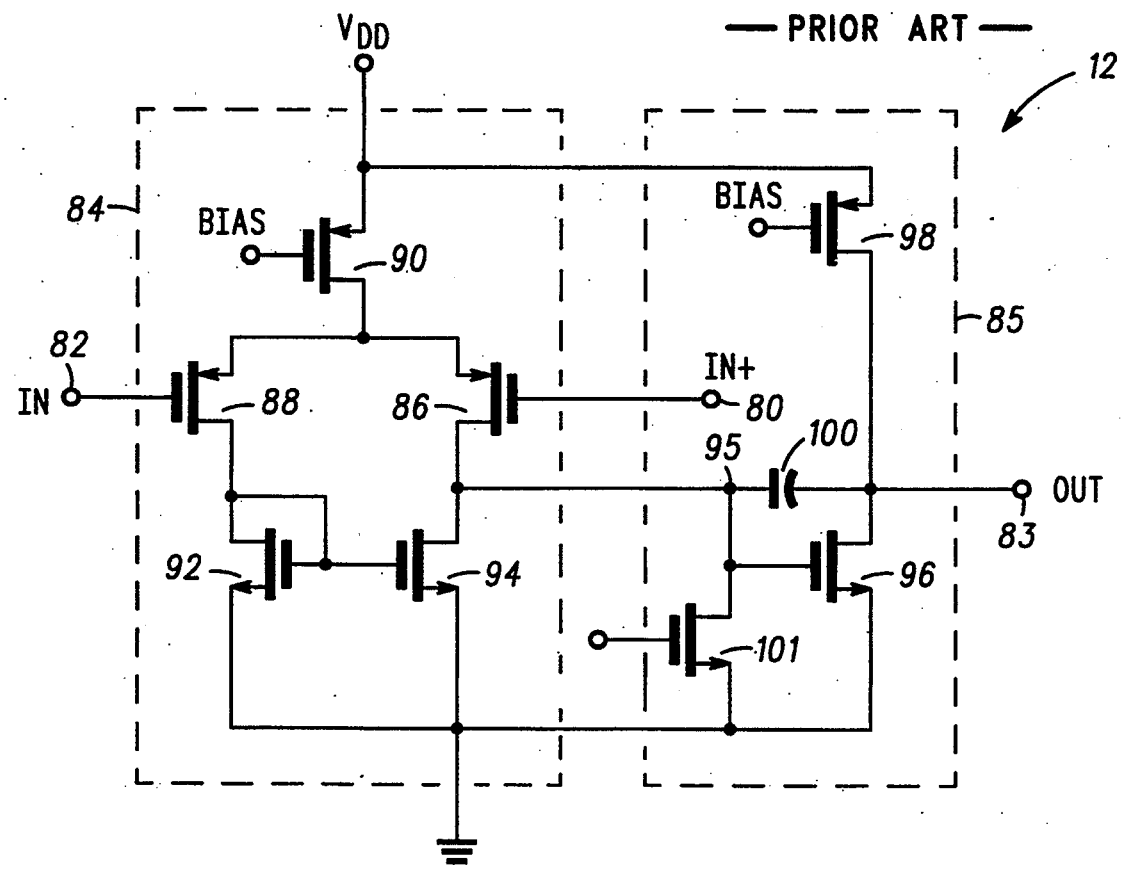
FIG. 3 is a detailed schematic of the preferred operational amplifier 12 of FIG. 2.

FIG. 3 illustrates the preferred op amp topology of op amp 12 of FIG. 2. This well-known topology has a non-inverting input 80, an inverting input 82, and an output 83. It consists of a differential gain stage 84 and a common-source gain stage 85. Transistor 86, connected to the non-inverting input, and transistor 88, connected to the inverting input, form a differential pair. Transistor 90 provides a current source bias for transistors 86 and 88. Transistor 92, connected as a diode, and transistor 94, providing an output 95 for the first stage 84, form a current mirror load for transistors 86 and 88. Transistor 96 is the common-source device for second stage 85, and transistor 98 provides a bias and load for transistor 96. Open-loop frequency compensation for the amplifier is provided from the output 83 to the input 95 of the second stage 85 by capacitor 100. Op amp 12 can be disabled and placed in a low-power standby mode by turning off current source biases 90 and 98, and enabling transistor 101.

The offset voltage of this amplifier can be made to be essentially fixed at a value approximately equal to the random threshold voltage mismatch of transistors 86 and 88. This allows the circuit of the present invention to have minimal distortion.

Consideration must be made of the common-mode input voltage range of the amplifier. Let the common-mode input voltage of this amplifier be denoted by Vcm. It is defined as the average of the non-inverting and inverting input voltages. For the amplifier to maintain high gain, Vcm is constrained not to exceed $$Vdd - (|Vdsat86| + |Vt86| + |Vdsat90|)$$

where Vdd is the supply voltage, $|Vdsat86|$ is the absolute value of the drain-source saturation voltage of transistor 86, $|Vt86|$ is the absolute value of the threshold voltage of transistor 86, and $|Vdsat90|$ is the absolute value of the drain-source saturation voltage of transistor 90.

For typical integrated circuit processes, the value $$(|Vdsat86| + |Vt86| + |Vdsat90|)$$

may not be made arbitrarily small, being constrained by the threshold voltage of the process. This common-mode range limitation is especially constrictive in low-voltage systems, where the threshold voltage is a significant fraction of the supply voltage. The present circuit accommodates this limitation by performing a voltage division of the input voltage relative to a ground potential.

Figure 4:
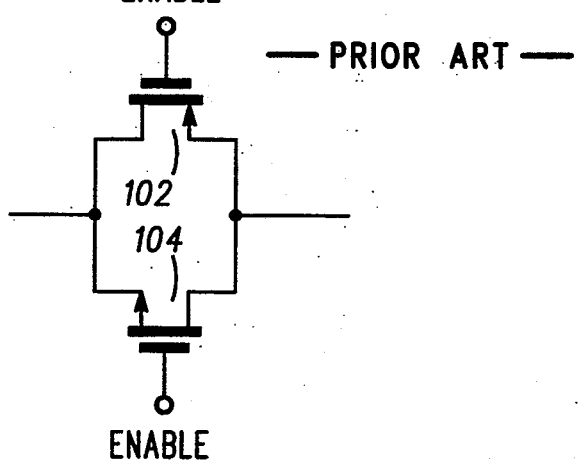
FIG. 4 is an example of a switch which could be incorporated in the device of FIG. 2.

FIG. 4 is the preferred embodiment of the switches shown in FIG. 2. This well-known transmission gate topology uses a P transistor 102 in parallel with an N transistor 104. Although a single transistor switch can also perform the same function, this topology has a wider operating voltage range than a single transistor.

Both the single-transistor and the preferred switch have a significant resistance. The resistance of a single device can be approximated by the expression $$1/[\mu Cox (W/L)(Vgs - Vt)]$$

where $\mu$ is the mobility of the diffusion of the channel of the device, Cox is the capacitance of the oxide of the device, W and L denote the width and length of the device respectively, Vgs is the gate-source driving potential, and Vt is the threshold voltage of the device.

This resistance is also highly nonlinear. The gate potential is fixed, while the source potential is equal the voltage being switched. The threshold voltage increases with increasing source-bulk bias. The resistance becomes infinite when Vt exceeds Vgs. For these reasons, a P and an N device are used in parallel to increase the operating voltage range of the switch.

The significant resistance of a transmission gate switch causes a voltage error when a switch network for connecting multiple inputs is used with circuit 10 of FIG. 1. Resistors 18 and 20 present a finite input impedance to the source driving node 14. This causes a current to flow though the switch network, and a potential drop develops across the network between the driving source and node 14. It is the voltage at node 14 that is produced at output 16, and not the desired driving voltage source value. The present invention of FIG. 2 eliminates this error by placing an equivalent switch network 60 in series with resistor 24. The nonlinearity of the resistance of a transmission gate switch is compensated by maintaining the; voltages across the equivalent compensating switch to be substantially equal to those voltages appearing across the corresponding input transmission gate switch.

In summary, the present invention provides a buffer circuit and a method of generating a buffered output in a circuit having selectable inputs. Unlike the prior art depicted in FIG. 1 which provides a low-distortion buffer for a single input voltage, the present invention provides means of controlled selection of multiple inputs by means of a switch network. The error introduced by the associated resistance of the network is canceled by placing an equivalent network in the feedback path of the amplifier. Also, the prior art depicted in FIG. 1 suffers from excessive power dissipation in resistors 18, 20, 24, and 26 when the circuit is not needed. The present invention further provides means of reduction of power consumption by breaking continuous current paths with switches. Finally, the present invention provides means of eliminating undesirable transients when the circuit is re-enabled. When the circuit is disabled, the output node is connected to a known potential. When the circuit is re-enabled, there is minimal excursion of the output voltage.

We claim:

1. A buffer circuit having a first terminal for receiving an input, a second terminal and an output, said buffer circuit comprising:
    an input network having a first resistor and a first switching device coupled in series to said first terminal;
    a second resistor coupled between said first resistor at said first terminal and a ground potential;
    a feedback network having a third resistor and second switching device in series coupling said output of said buffer circuit to said second terminal, said feedback network having substantially the same impedance as said input network; and
    a fourth resistor, substantially identical to said second resistor, coupling said second terminal to said ground potential.

2. The buffer circuit according to claim 1 wherein said input network includes a plurality of input paths each having a predetermined number of switches and wherein said feedback network has said predetermined number switches.

3. The buffer circuit according to claim 2 wherein said predetermined number of switches in each of said plurality of input paths are coupled in series and said predetermined number of switches in said feedback path are coupled in series.

4. The buffer circuit according to claim 1 further including a switch coupled between said second resistor and said ground potential and a switch coupled between said fourth resistor and said ground potential.

5. The buffer circuit according to claim 1 further including a switch coupled between said output and a predetermined potential.

6. A buffer circuit having an op amp having a first input, a second input and an output wherein said output is coupled to said second input in a feedback arrangement, said buffer circuit comprising:
    a resistor divider network having a first resistor and a second resistor coupled to said first input, said second resistor being coupled to a ground potential;
    a first switching device coupled in series with said first resistor of said resistor divider network;
    a third resistor coupled to said second input;
    a second switching device in series with said third resistor, said second switching device being coupled to said output to provide a feedback path to said second input, wherein the impedance of said second switching device and said third resistor is equal to the impedance of said first resistor and said first switching device; and
    a fourth resistor, substantially identical to said second resistor, coupling said second input to ground.

7. The buffer circuit according to claim 6 wherein said input network includes a plurality of input paths each having a predetermined number of switches, and wherein said feedback network has said predetermined number switches.

8. The buffer circuit according to claim 6 wherein said predetermined number of switches in each of said plurality of input paths are coupled in series and wherein said predetermined number of switches in said feedback path are coupled in series.

9. The buffer circuit according to claim 6 further including a switch between said second resistor and said ground potential and a switch between said fourth resistor and said ground potential.

10. The buffer circuit according to claim 6 further including a switch providing a path from said output to a predetermined potential.

11. A buffer circuit adapted to receive a plurality of inputs, said buffer circuit having an op amp with a first input, a second input and an output wherein said output is coupled to said second input in a feedback arrangement, said buffer circuit comprising:
    a resistor divider network having a first resistor and a second resistor coupled to said first input, said second resistor being coupled to a ground potential;
    a first switching device having a plurality of switches coupled in series with said first resistor of said resistor divider network;
    a first switch coupled between said second resistor and said ground potential;
    a third resistor coupled to said second input;
    a second switching device having a plurality of switches coupled to said output of said op amp and said third resistor to provide a feedback path between said output and said second input, wherein the impedance of said second switching device and said third resistor is equal to the impedance of said first resistor and said first switching device;
    a fourth resistor, substantially identical to said second resistor, coupled to said second input;
    a second switch coupled between said fourth resistor and said ground potential; and
    a third switch coupled between said output and a predetermined potential.

12. A method for generating a buffered output signal, said method comprising the steps of:
    providing an attenuated input signal to a first input of a buffer circuit by way of a selection circuit having switches;
    providing a feedback path having switches, said feedback path being coupled to a second input and having an attenuation substantially equal to the attenuation of the input selection circuit; and
    generating an output signal substantially equal to the input signal.

13. The method for generating a buffered output according to claim 12 further including a step of disconnecting the selection circuit and the feedback path.

14. The method for generating a buffered output according to claim 12 further including a step of connecting the output signal to a predetermined ground potential.

* * * * *